(12) United States Patent
Hashiguchi et al.

(10) Patent No.: US 11,527,968 B2
(45) Date of Patent: Dec. 13, 2022

(54) METHOD OF MANUFACTURING MEMS VIBRATION ELEMENT AND MEMS VIBRATION ELEMENT

(71) Applicants: National University Corporation Shizuoka University, Shizuoka (JP); Saginomiya Seisakusho, Inc., Tokyo (JP)

(72) Inventors: Gen Hashiguchi, Hamamatsu (JP); Hideaki Koga, Sayama (JP)

(73) Assignees: National University Corporation Shizuoka University; Saginomiya Seisakusho, Inc., Tokyo (JP)

( * ) Notice: Subject to any disclaimer, the term of this patent is extended or adjusted under 35 U.S.C. 154(b) by 384 days.

(21) Appl. No.: 16/636,777

(22) PCT Filed: Aug. 8, 2018

(86) PCT No.: PCT/JP2018/029842
§ 371 (c)(1),
(2) Date: Feb. 5, 2020

(87) PCT Pub. No.: WO2019/031565
PCT Pub. Date: Feb. 14, 2019

(65) Prior Publication Data
US 2021/0376767 A1 Dec. 2, 2021

(30) Foreign Application Priority Data
Aug. 9, 2017 (JP) .............................. JP2017-154474

(51) Int. Cl.
*H02N 1/08* (2006.01)
*B81B 3/00* (2006.01)
*B81C 1/00* (2006.01)

(52) U.S. Cl.
CPC ............. *H02N 1/08* (2013.01); *B81B 3/0037* (2013.01); *B81C 1/00166* (2013.01);
(Continued)

(58) Field of Classification Search
None
See application file for complete search history.

(56) References Cited

U.S. PATENT DOCUMENTS

| 2009/0184781 A1* | 7/2009 | Ni ...................... H03H 9/02259 333/175 |
| 2014/0065751 A1 | 3/2014 | Suzuki et al. |

(Continued)

FOREIGN PATENT DOCUMENTS

| JP | 2006-5731 A1 | 1/2006 |
| JP | 2009-171394 A | 7/2009 |

(Continued)

OTHER PUBLICATIONS

Japanese-language Office Action issued in Japanese Application No. 2017-154474 dated Aug. 3, 2021 with English translation (six (6) pages).

(Continued)

*Primary Examiner* — Jay C Chang
(74) *Attorney, Agent, or Firm* — Crowell & Moring LLP (57) ABSTRACT

A method of manufacturing a MEMS vibration element having a fixed electrode, a movable electrode, and an elastic supporting unit that elastically supports the movable electrode with respect to the fixed electrode includes: etching a base material having a first thickness to form the fixed electrode and the movable electrode; and etching the base material to form the elastic supporting unit having a second thickness, the second thickness being less than the first thickness.

3 Claims, 10 Drawing Sheets

(52) U.S. Cl.
CPC ... *B81B 2203/0136* (2013.01); *B81B 2203/04* (2013.01); *B81C 2201/0132* (2013.01)

(56) References Cited

U.S. PATENT DOCUMENTS

| | | |
|---|---|---|
| 2015/0070941 A1 | 3/2015 | Suzuki et al. |
| 2019/0031499 A1* | 1/2019 | Pregl .................. B81C 1/00166 |
| 2019/0058420 A1 | 2/2019 | Toshiyoshi et al. |

FOREIGN PATENT DOCUMENTS

| | | |
|---|---|---|
| JP | 2013-13256 A | 1/2013 |
| JP | 2013-172523 A | 9/2013 |
| JP | 2014-49557 A | 3/2014 |
| JP | 2016-82836 A | 5/2016 |
| JP | 2017-70163 A | 4/2017 |
| WO | WO 2014/034602 A1 | 3/2014 |
| WO | WO 2017/057317 A1 | 4/2017 |

OTHER PUBLICATIONS

International Search Report (PCT/ISA/210) issued in PCT Application No. PCT/JP2018/029842 dated Nov. 6, 2018 with English translation (three (3) pages).

Japanese-language Written Opinion (PCT/ISA/237) issued in PCT Application No. PCT/JP2018/029842 dated Nov. 6, 2018 (three (3) pages).

* cited by examiner

METHOD OF MANUFACTURING MEMS VIBRATION ELEMENT AND MEMS VIBRATION ELEMENT

TECHNICAL FIELD

The present invention relates to a method of manufacturing a MEMS vibration element and a MEMS vibration element.

BACKGROUND ART

As one of energy harvesting technologies for harvesting energy from environmental vibrations, an approach of generating electric power from environmental vibrations using a vibration-driven energy harvester, which is a MEMS (Micro Electro Mechanical Systems) vibration element, is known (for example, PTL1). An environmental vibration includes a variety of frequency bands. For the purpose of effectively performing vibration-driven energy harvesting, it is necessary to match a resonance frequency of the vibration-driven energy harvester with a predominant frequency.

In the vibration-driven energy harvester, a movable electrode is supported by an elastic supporting unit such as a cantilever. The movable electrode vibrates with respect to a fixed electrode to generate electric power. Since the resonance frequency of the vibration-driven energy harvester depends on a spring constant of the elastic supporting unit, it is necessary to adjust the thickness, length, and the like of the elastic supporting unit in order to match the resonance frequency with the predominant frequency.

CITATION LIST

Patent Literature

PTL1: Japanese Laid-Open Patent Publication No. 2013-172523

SUMMARY OF INVENTION

Technical Problem

Here, the predominant frequency differs depending on environments in which vibration is to be detected. Thus, in conventional vibration-driven energy harvesters, the thickness, length, and the like of the elastic supporting unit are re-designed to a target environment. Therefore, the conventional vibration-driven energy harvester cannot easily be adapted to various predominant frequencies and a lot of cost and effort are required to adapt them.

Solution to Problem

A method of manufacturing a MEMS vibration element according to the 1st aspect of the present invention, the MEMS vibration element having a fixed electrode, a movable electrode, and an elastic supporting unit that elastically supports the movable electrode with respect to the fixed electrode, comprises: etching a base material having a first thickness to form the fixed electrode and the movable electrode; and etching the base material to form the elastic supporting unit having a second thickness, the second thickness being less than the first thickness.

The method of manufacturing a MEMS vibration element according to the 2nd aspect of the present invention is in the method of manufacturing a MEMS vibration element according to the 1st aspect, further comprises forming the elastic supporting unit after the fixed electrode and the movable electrode are formed.

The method of manufacturing a MEMS vibration element according to the 3rd aspect of the present invention is in the method of manufacturing a MEMS vibration element according to the 1st or 2nd aspect, wherein it is preferred that the fixed electrode and the movable electrode are electrodes having a comb structure.

A MEMS vibration element according to the 4th aspect of the present invention comprises: a fixed electrode formed on a base material; a movable electrode formed on the base material; and an elastic supporting unit formed on the base material and elastically supporting the movable electrode with respect to the fixed electrode, wherein at least a portion of the elastic supporting unit has a dimension in a thickness direction of the base material, the dimension being smaller than a dimension of the fixed electrode and the movable electrode in the thickness direction of the base material.

A MEMS vibration element according to the 5th aspect of the present invention is in the MEMS vibration element according to the 4th aspect, wherein it is preferred that the fixed electrode and the movable electrode are electrodes having a comb structure.

A MEMS vibration element according to the 6th aspect of the present invention is in the MEMS vibration element according to the 5th aspect, wherein it is preferred that a length dimension of the portion of the elastic supporting unit along an extending direction of the elastic supporting unit is larger than a length dimension of comb teeth of the movable electrode.

Advantageous Effects of Invention

According to the present invention, a MEMS vibration element adapted to different environmental vibrations may be easily manufactured.

DESCRIPTION OF EMBODIMENTS

Figure 1:
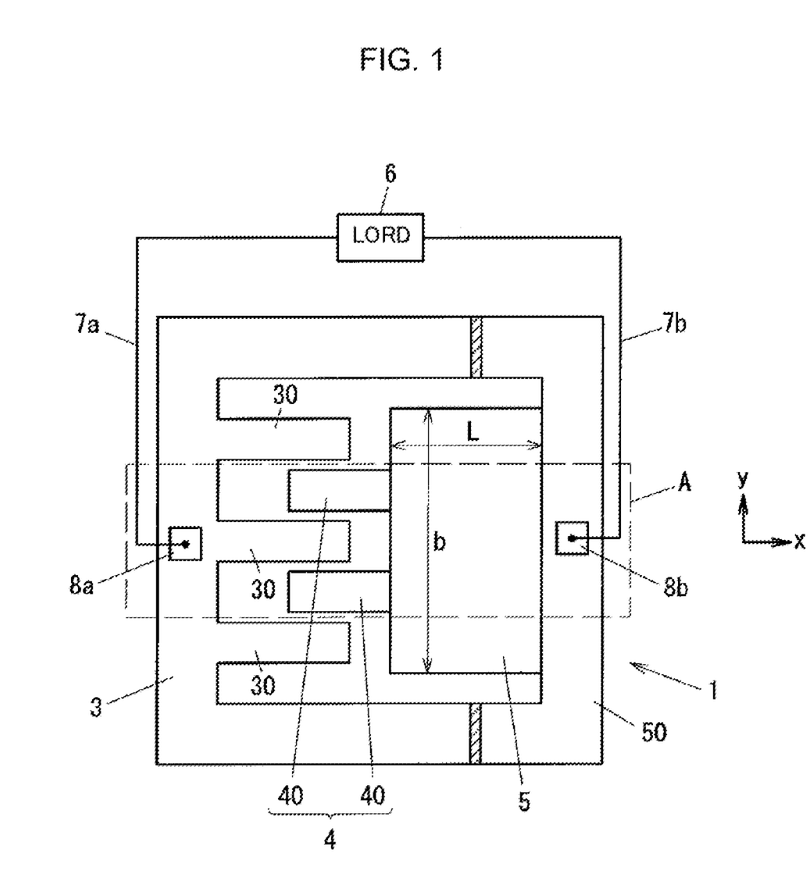
FIG. 1 is a schematic view showing a schematic configuration of a vibration-driven energy harvester.
Figure 2:
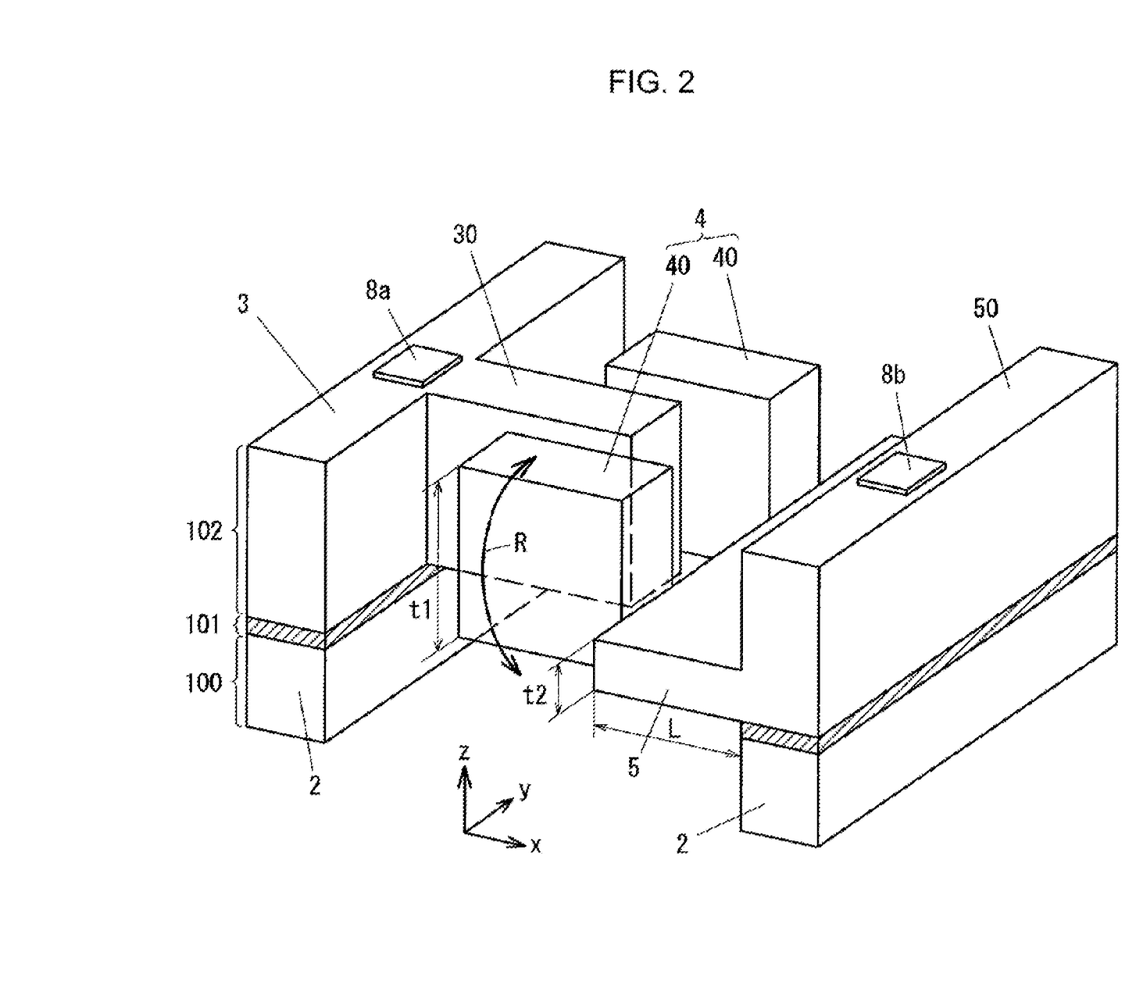
FIG. 2 is a perspective view showing a part of the vibration-driven energy harvester.

Hereinafter, embodiments of the present invention will be described with reference to the drawings. FIG. 1 shows an example of a MEMS vibration element according to an embodiment of the present invention. FIG. 1 is a plan view showing a schematic configuration in a case where the MEMS vibration element is applied to a vibration-driven energy harvester 1. FIG. 2 is a perspective view of a portion denoted by reference numeral A in FIG. 1.

Note that the MEMS vibration element according to the present embodiment may be applied not only to the vibration-driven energy harvester 1, but also to microphones and the like.

The vibration-driven energy harvester 1 includes a base 2, a fixed electrode 3, a movable electrode 4, and an elastic supporting unit 5. A load 6 is connected to the vibration-driven energy harvester 1. In the present embodiment, each of the fixed electrode 3 and the movable electrode 4 has a comb structure as shown in FIGS. 1 and 2. The fixed electrode 3 has a plurality of comb teeth 30 and the movable electrode 4 has a plurality of comb teeth 40. The fixed electrode 3 and the movable electrode 4 are arranged so that the comb teeth 30 and the comb teeth 40 are meshed with each other with a gap therebetween.

In this way, the fixed electrode 3 constitutes a fixed comb electrode and the movable electrode 4 constitutes a movable comb electrode. The term "comb electrode" means an electrode having a plurality of comb teeth arranged in parallel, such as the fixed electrode 3 and the movable electrode 4 in FIG. 1. Note that the number of the comb teeth in the present invention is not limited to that shown in FIG. 1.

The vibration-driven energy harvester 1 according to the present embodiment is formed by a general MEMS processing technique using a silicon substrate or an SOI (Silicon On Insulator) substrate. Although the vibration-driven energy harvester 1 is formed from the SOI substrate in the example shown in FIGS. 1 and 2, the vibration-driven energy harvester 1 may also be formed from a silicon substrate in the same manner. In a case where a silicon substrate is used, for example, a P-type or N-type conductive layer may be formed by doping in a region at a predetermined thickness from a surface of an intrinsic silicon substrate having a small conductivity. The base 2 may be formed in an intrinsic silicon layer under the conductive layer, and the fixed electrode 3, the movable electrode 4, and the elastic supporting unit 5 may be formed in the conductive layer.

As shown in FIG. 2, the SOI substrate includes a handle layer 100 made of Si, a BOX layer 101 made of SiO$_2$, and a device layer 102 made of Si. The handle layer 100 constitutes the base 2, and the device layer 102 constitutes the fixed electrode 3, the movable electrode 4, and the elastic supporting unit 5. One end of the elastic supporting unit 5 is fixed to the base 2 by a fixing portion 50 provided at the right side of the elastic supporting unit 5 in the figure. The comb teeth 40 constituting the movable electrode 4 are provided on a left end of the elastic supporting unit 5 in the figure.

One or both of the comb teeth 30 and the comb teeth 40 facing thereto have electrets formed in the vicinity of their surfaces facing the other teeth. In other words, one or both of the fixed electrode 3 and the movable electrode 4 is electrically charged. When vibration is applied to the vibration-driven energy harvester 1 from the outside, the elastic supporting unit 5 bends in the z direction so that the movable electrode 4 vibrates in the z direction as indicated by an arrow R. As a result, an area where the fixed electrode 3 and the movable electrode 4 face each other changes so that a capacitance between the fixed electrode 3 and the movable electrode 4 changes. This change and an induced charge of the electret then change a voltage between the fixed electrode 3 and the movable electrode 4 to generate an electromotive force, which allows the vibration-driven energy harvester 1 to generate power.

As shown in FIG. 1, the load 6 is connected to a pad 8a provided on the fixed electrode 3 via a lead 7a, and also connected to a pad 8b provided on the fixing portion 50 of the elastic supporting unit 5 via a lead 7b. The pad 8b is electrically connected to the movable electrode 4 via the elastic supporting unit 5. The electromotive force obtained by the power generation of the vibration-driven energy harvester 1 is applied to the load 6 so that the load 6 is driven.

A resonance frequency f [Hz] in the vibration-driven energy harvester 1 shown in FIGS. 1 and 2 is expressed by the following equation (1) as a function of a spring constant k of the elastic supporting unit 5 and a mass m [kg] of the movable electrode 4. The spring constant k is expressed by the following equation (2), where a thickness of the elastic supporting unit 5 in the z direction is t [m], a distance from a fulcrum to a load point (i.e., a length in the x direction of the elastic supporting unit 5) is L [m], a width dimension (i.e., a width dimension in the y direction of the elastic supporting unit 5) is b [m], and a Young's modulus is E [Pa]. Note that for a mass of the movable electrode 4 insufficient to use as the mass m in the expression (1), a weight for adjusting the mass is added to the movable electrode 4.

$$f=(1/2\pi)\sqrt{(k/m)} \tag{1}$$

$$k=(Eb/4L^3)t^3 \tag{2}$$

Method of Forming Vibration-Driven Energy Harvester 1

Figure 3A:
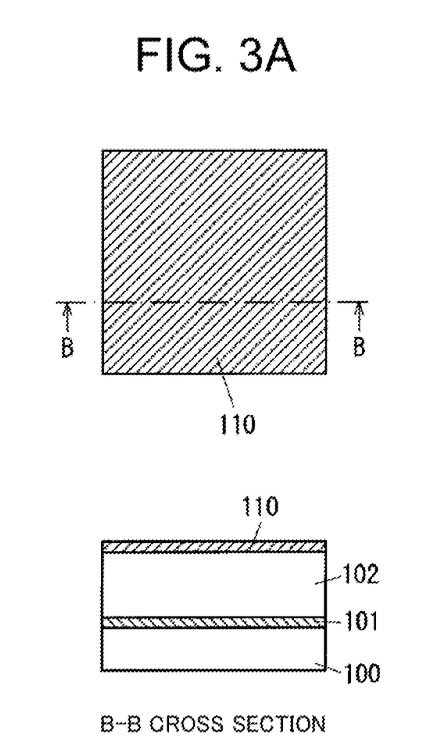
FIGS. 3A to 3C are views illustrating a method of forming the vibration-driven energy harvester.
Figure 3B:
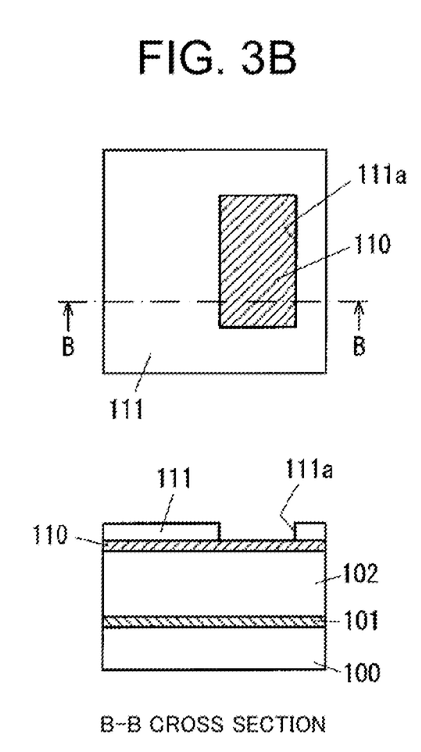
Figure 3C:
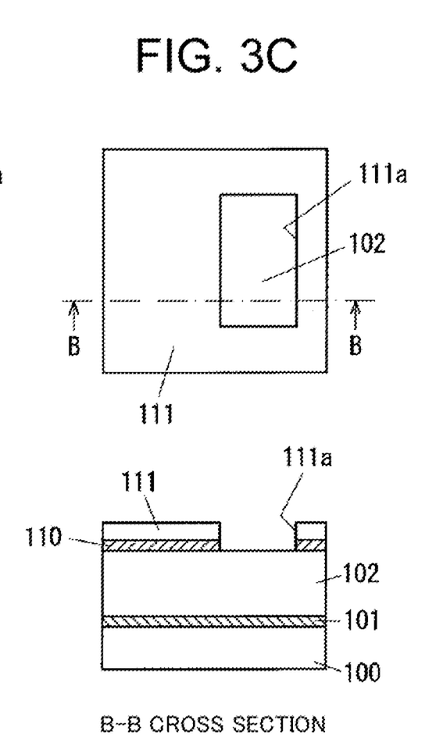
Figure 4A:
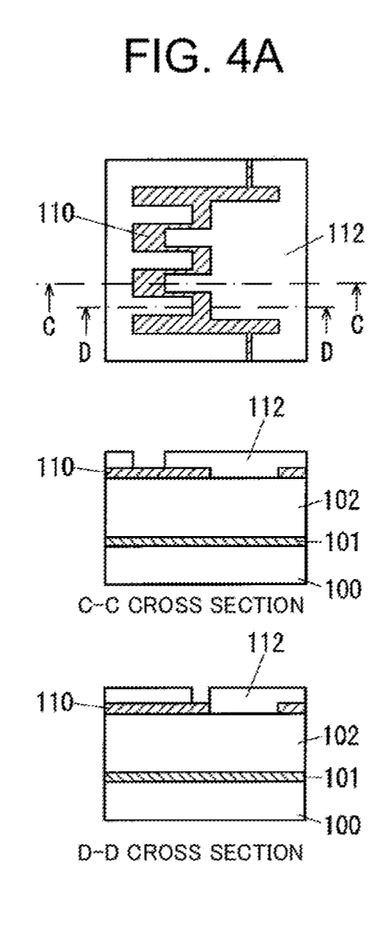
FIGS. 4A to 4C are views illustrating a procedure of forming the vibration-driven energy harvester, following the method in FIGS. 3A to 3C.
Figure 4B:
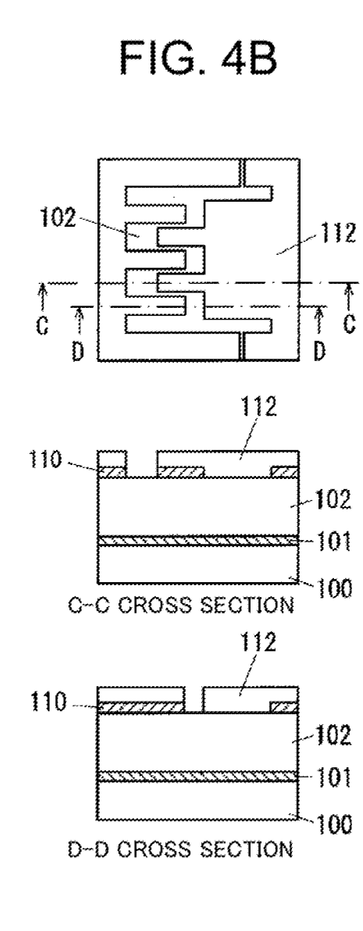
Figure 4C:
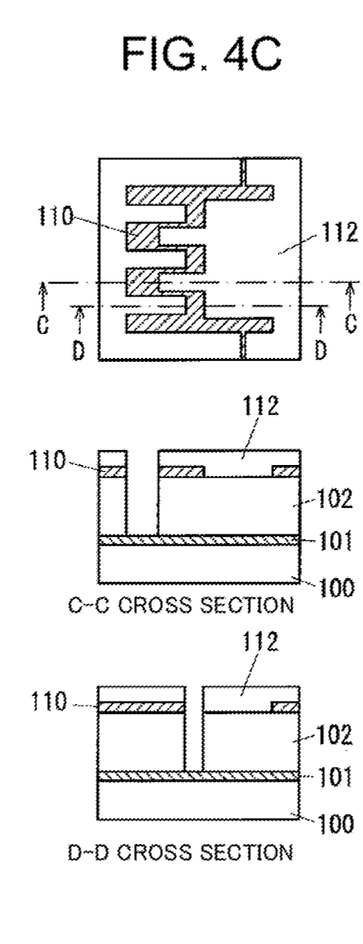
Figure 5A:
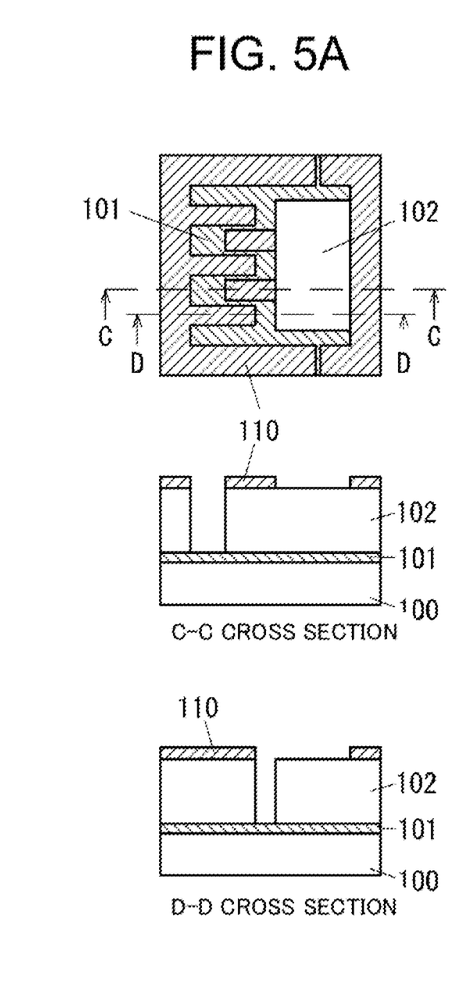
FIGS. 5A to 5C are views illustrating a procedure of forming the vibration-driven energy harvester, following the procedure in FIGS. 4A to 4C.
Figure 5B:
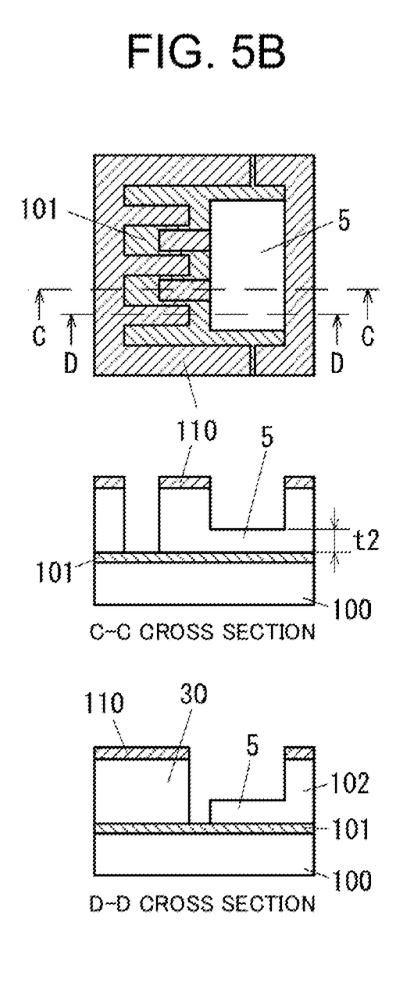
Figure 5C:
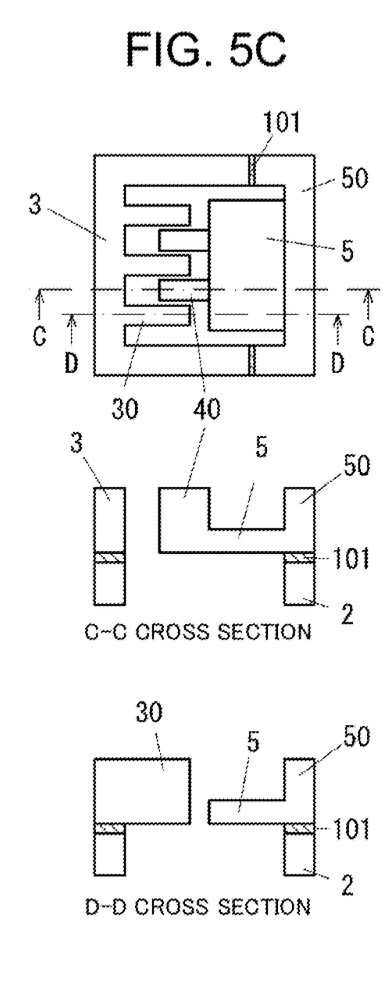

Now, referring to FIGS. 3 to 5, an example of a method of forming the vibration-driven energy harvester 1 will be described. Although the vibration-driven energy harvester 1 is here formed from the SOI substrate, the vibration-driven energy harvester 1 may also be formed from a silicon substrate in the same manner. Note that views in the upper row in FIG. 3 are plan views and views in the lower row in FIG. 3 is cross-sectional views taken along line B-B. Further, views in the upper row in each of FIGS. 4 and 5 are plan views, views in the middle row are cross-sectional views taken along line C-C, and views in the lower row are cross-sectional views taken along line D-D.

In a first step shown in FIG. 3(*a*), an aluminum (Al) layer 110 is formed by vacuum deposition or the like on a surface of the device layer 102 of the SOI substrate including the handle layer 100, the BOX layer 101, and the device layer 102.

In a second step shown in FIG. 3(*b*), a resist pattern 111 is formed by photolithographic processing using a photomask. The resist pattern 111 has a rectangular hole 111a formed therein, which corresponds to a planar shape of the elastic supporting unit 5.

In a third step shown in FIG. 3(*c*), the aluminum layer 110 is etched with the resist pattern 111 as a mask. Thus, the device layer 102 is exposed in a region of the rectangular hole 111a.

In a fourth step shown in FIG. 4(*a*), after removing the resist pattern 111 shown in FIG. 3(*c*), a resist pattern 112 is formed, which corresponds to planar shapes of the fixed electrode 3, the movable electrode 4, and the elastic supporting unit 5. Note that the rectangular hole formed in the aluminum layer 110 in the third step is covered with the resist pattern 112.

In a fifth step shown in FIG. 4(*b*), the aluminum layer 110 is etched with the resist pattern 112 as a mask. As a result, the aluminum layer 110 is removed in regions corresponding to gap portions except for regions corresponding to the fixed electrode 3, the movable electrode 4, and the elastic supporting unit 5, so that the device layer 102 is exposed in the removed regions.

In a sixth step shown in FIG. 4(c), the device layer 102 is subjected to DRIE (Deep Reactive Ion Etching) processing with the resist pattern 112 as a mask. The etching processing is carried out until the BOX layer 101 is reached. By this etching processing, the fixed electrode 3 and the movable electrode 4 are formed in the device layer 102.

In a seventh step shown in FIG. 5(a), the resist pattern 112 shown in FIG. 4(c) is removed. As a result, the device layer 102 is exposed in a region where the elastic supporting unit 5 is to be formed.

In an eighth step shown in FIG. 5(b), the device layer 102 is subjected to DRIE processing to a predetermined depth, with the aluminum layer 110 as a mask. By this etching processing, the elastic supporting unit 5 having a predetermined thickness t2 is formed in the device layer 102.

In a ninth step shown in FIG. 5(c), an aluminum pattern (not shown) as an etching mask having a rectangular frame shape is formed on a surface of the handle layer 100, and the handle layer 100 is then subjected to DRIE processing to form the base 2 having a rectangular frame shape. Thereafter, the aluminum layer 110 is removed. Note that any BOX layer ($SiO_2$ layer) exposed on the lower surface side of the fixed electrode 3, the movable electrode 4, and the elastic supporting unit 5 is removed by strong hydrofluoric acid.

Thereafter, the pads 8a, 8b are formed and then an electret is formed on one or both of the comb teeth 30, 40 by known charging processing (for example, charging processing described in Japanese Laid-Open Patent Publication No. 2014-049557) to form the vibration-driven energy harvester 1.

Other Forming Method

Figure 6A:
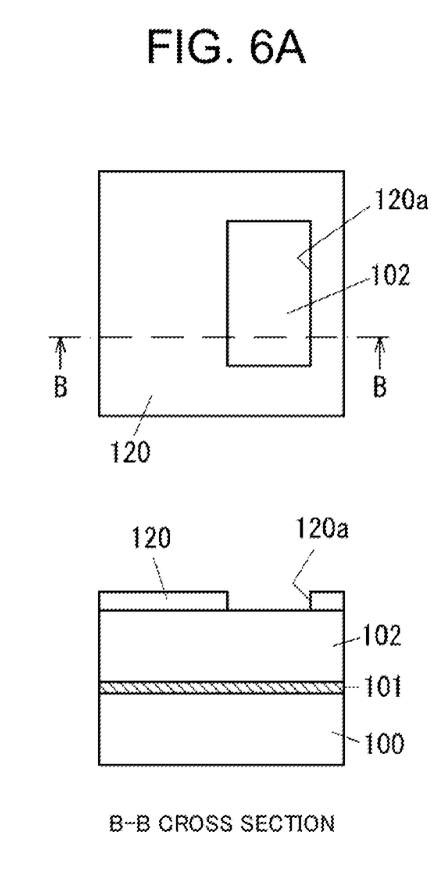
FIGS. 6A to 6C are views illustrating another example of the method of forming the vibration-driven energy harvester.
Figure 6B:
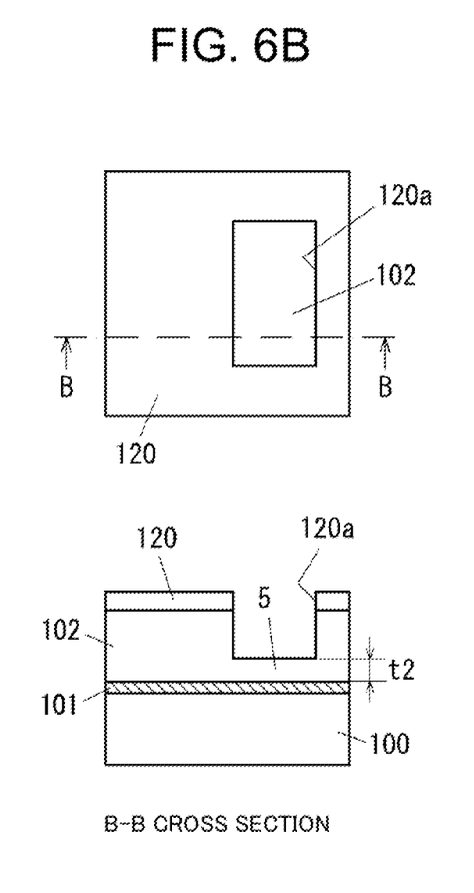
Figure 6C:
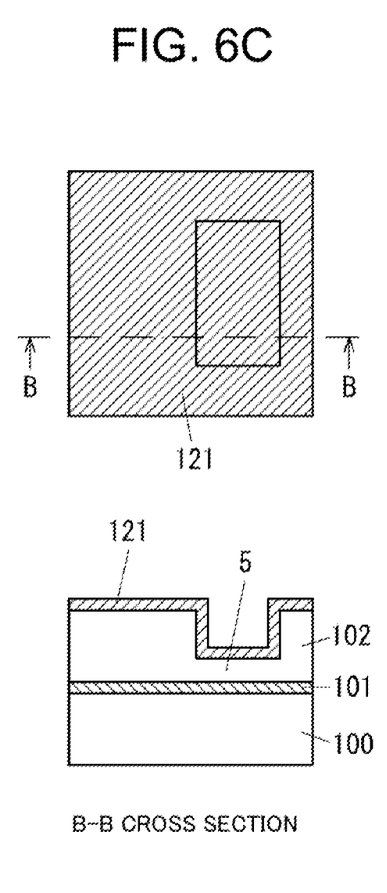
Figure 7A:
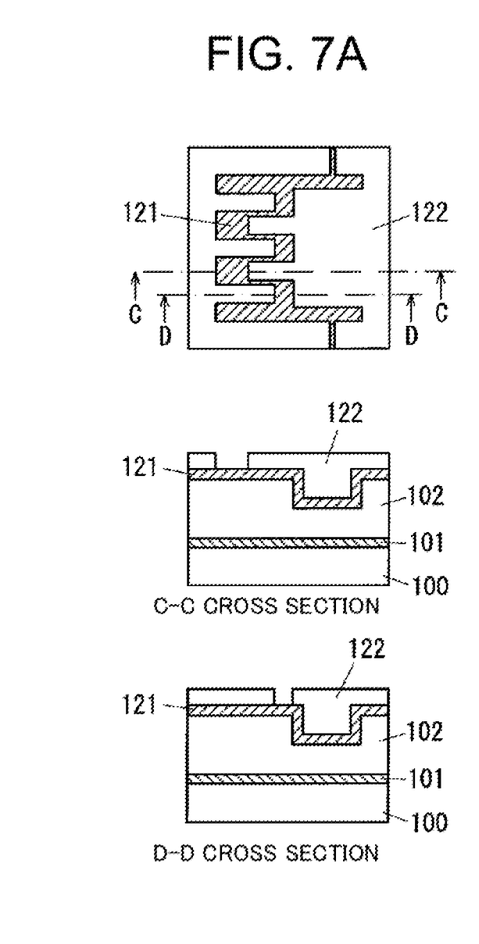
FIGS. 7A to 7C are views illustrating a procedure of forming the vibration-driven energy harvester, following the method in FIGS. 6A to 6C.
Figure 7B:
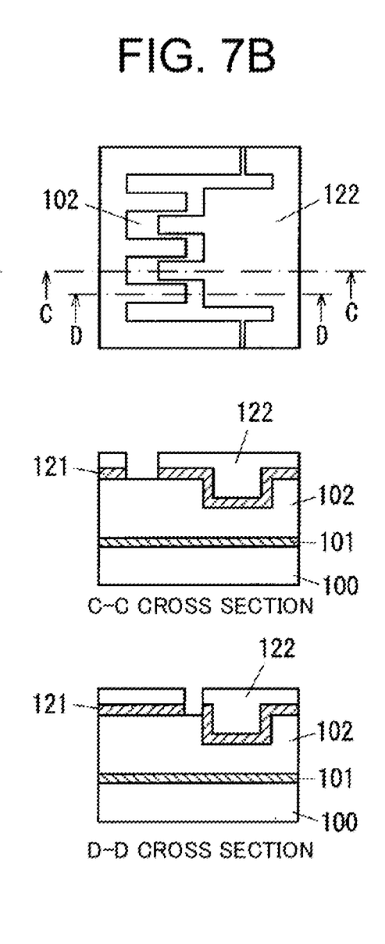
Figure 7C:
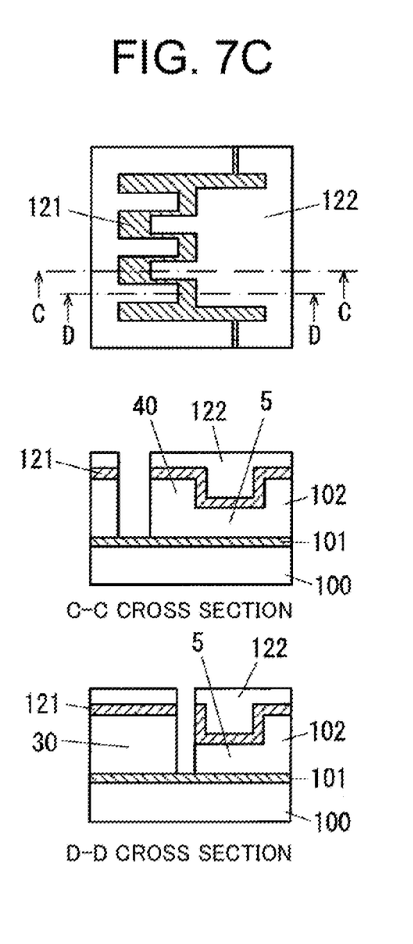

FIGS. 6 and 7 are views for illustrating another example of the method of forming the vibration-driven energy harvester 1. In the forming method described with reference to FIGS. 3 to 5, the elastic supporting unit 5 is formed after the fixed electrode 3 and the movable electrode 4 are formed. However, in the forming method shown in FIGS. 6 and 7, the fixed electrode 3 and the movable electrode 4 are formed after the elastic supporting unit 5 is formed.

In a first step shown in FIG. 6(a), a resist pattern 120 is formed on a surface of the device layer 102 of the SOI substrate by photolithographic processing using a photomask. The resist pattern 120 has a rectangular hole 120a formed therein, which corresponds to a planar shape of the elastic supporting unit 5. The device layer 102 is exposed from the rectangular hole 120a.

In a second step shown in FIG. 6(b), the device layer 102 is subjected to DRIE processing to a predetermined depth, with the resist pattern 120 as a mask. By this etching processing, the elastic supporting unit 5 having a predetermined thickness t2 is formed in the device layer 102.

In a third step shown in FIG. 6(c), after the resist pattern 120 shown in FIG. 6(b) is removed, an aluminum layer 121 is formed by vacuum deposition or the like.

In a fourth step shown in FIG. 7(a), a resist pattern 122 corresponding to planar shapes of the fixed electrode 3, the movable electrode 4, and the elastic supporting unit 5 is formed on an upper surface of the aluminum layer 121. The aluminum layer 110 is exposed in regions of the resist pattern 122 corresponding to gap portions except for regions corresponding to the fixed electrode 3, the movable electrode 4, and the elastic supporting unit 5.

In a fifth step shown in FIG. 7(b), the aluminum layer 121 is etched with the resist pattern 122 as a mask. As a result, the aluminum layer 110 is removed in regions corresponding to gap portions except for regions corresponding to the fixed electrode 3, the movable electrode 4, and the elastic supporting unit 5, so that the device layer 102 is exposed in the removed regions.

In a sixth step shown in FIG. 7(c), the device layer 102 is subjected to DRIE processing with the resist pattern 122 and the aluminum layer 121 as masks. The etching processing is carried out until the BOX layer 101 is reached. By this etching processing, the fixed electrode 3 and the movable electrode 4 are formed in the device layer 102.

Although not illustrated in the drawings, in the next step following the sixth step, the base 2 is formed in the handle layer 100 by etching processing in the same manner as in the case shown in FIG. 5(c), and then the aluminum layer 121 and the resist pattern 122 are removed. Thereafter, the pads 8a, 8b are formed and then an electret is formed on one or both of the comb teeth 30, 40 by known charging processing (for example, charging processing described in Japanese Laid-Open Patent Publication No. 2014-049557) to form the vibration-driven energy harvester 1.

Note that although the resist pattern 122 and the aluminum layer 121 are used as etching masks in the step shown in FIG. 7(c), the aluminum layer 121 may be omitted and only the resist pattern 122 may be used as a mask. However, in a case where there is an uneven structure such as a portion formed by the elastic supporting unit 5, it is difficult to uniformly apply a resist over all portions including recessed portions. In contrast thereto, in a case where the aluminum layer 121 is formed by aluminum deposition, the aluminum layer 121 can be formed uniformly as shown in FIG. 6(c). Therefore, in order to reliably and accurately perform etching of the device layer 102 shown in FIG. 7(c), it is preferable to use the resist pattern 122 and the aluminum layer 121 as etching masks, as shown in FIG. 7(c).

In the vibration-driven energy harvester 1 of the present embodiment which is a MEMS vibration element, as described above, the fixed electrode 3, the movable electrode 4, and the elastic supporting unit 5 are formed by the device layer 102 which is the one and same base material for all of the units. The thickness of the elastic supporting unit 5 (i.e., the dimension of the device layer 102 in the thickness direction) is made thinner than the thickness of the fixed electrode 3 and the movable electrode 4.

In order to increase power generation output of the vibration-driven energy harvester 1, it is necessary to make the areas of the fixed electrode 3 and the movable electrode 4 larger. For this purpose, a larger thickness t1 of the fixed electrode 3 and the movable electrode 4 is more preferable. On the other hand, an environmental vibration may have a predominant frequency as low as several tens of Hz. In such a case, it is necessary to reduce the thickness t2 of the elastic supporting unit 5, thereby reducing the resonance frequency. In other words, providing the thicknesses t1, t2 as described above and adjusting the thickness t2 by controlling an etching depth allow easy adaptation to different predominant frequencies.

Additionally, in a case where the fixed electrode 3, the movable electrode 4, and the elastic supporting unit 5 are simultaneously processed by etching processing, unlike the present embodiment, they are etched at the same etching rate to have the same thickness dimensions. Therefore, in order to match the resonance frequency of the vibration-driven energy harvester 1 with a predominant frequency of an environmental vibration, the width dimension (dimension b in FIG. 1) and the length dimension (dimension L in FIG. 2) of the elastic supporting unit 5 are adjusted. As a result, a mask for forming the elastic supporting unit 5 needs to be re-created every time the predominant frequency varies. This requires a lot of cost and effort, which is a problem.

On the other hand, in the present embodiment, the thickness t2 of the elastic supporting unit 5 is set smaller than the thickness dimension t1 of the movable electrode 4 as shown in FIG. 2. Therefore, the etching processing of the fixed electrode 3 and the movable electrode 4 and the etching processing of the elastic supporting unit 5 are performed separately. As a result, the fixed electrode 3 and the movable electrode 4 having a comb structure with a narrow gap and the elastic supporting unit 5 having a relatively wide etching area can be etched under individually suitable etching conditions. The thickness of the elastic supporting unit 5 can thus be easily adjusted.

In other words, as in the manufacturing method described above, the device layer 102 which is the base material is etched so that the fixed electrode 3 and the movable electrode 4 is formed to have the thickness t1, and the device layer 102 is etched so that the elastic supporting unit 5 is formed to have the thickness t2 which is thinner than the thickness t1, thereby forming the elastic supporting unit 5 having a desired thickness with a high precision. Therefore, adaptation to different predominant frequencies can be achieved only by adjusting the thickness t2 of the elastic supporting unit 5 without re-creating a mask or the like.

In particular, in a case where the fixed electrode 3 and the movable electrode 4 are electrodes having comb structures as in the above-described embodiment, the gaps between the comb teeth 30 and the comb teeth 40 are narrower than the gap around the elastic supporting unit 5. Separately performing the etching processing of the fixed electrode 3 and the movable electrode 4 and the etching processing of the elastic supporting unit 5, which have conditions significantly different from each other, can provide etching under individually suitable processing conditions.

Additionally, it is preferable to form the elastic supporting unit 5 having a smaller thickness t2 after forming the fixed electrode 3 and the movable electrode 4 having a larger thickness t1. In this way, an effect can be expected, for example, that even when the etching is finished in a state in which a penetration state in penetration portions of the fixed electrode 3 and the movable electrode 4 is insufficient, the penetration state in the penetration portions is improved when the subsequent etching process of the elastic supporting unit 5 is performed.

First Modification

Figure 8:
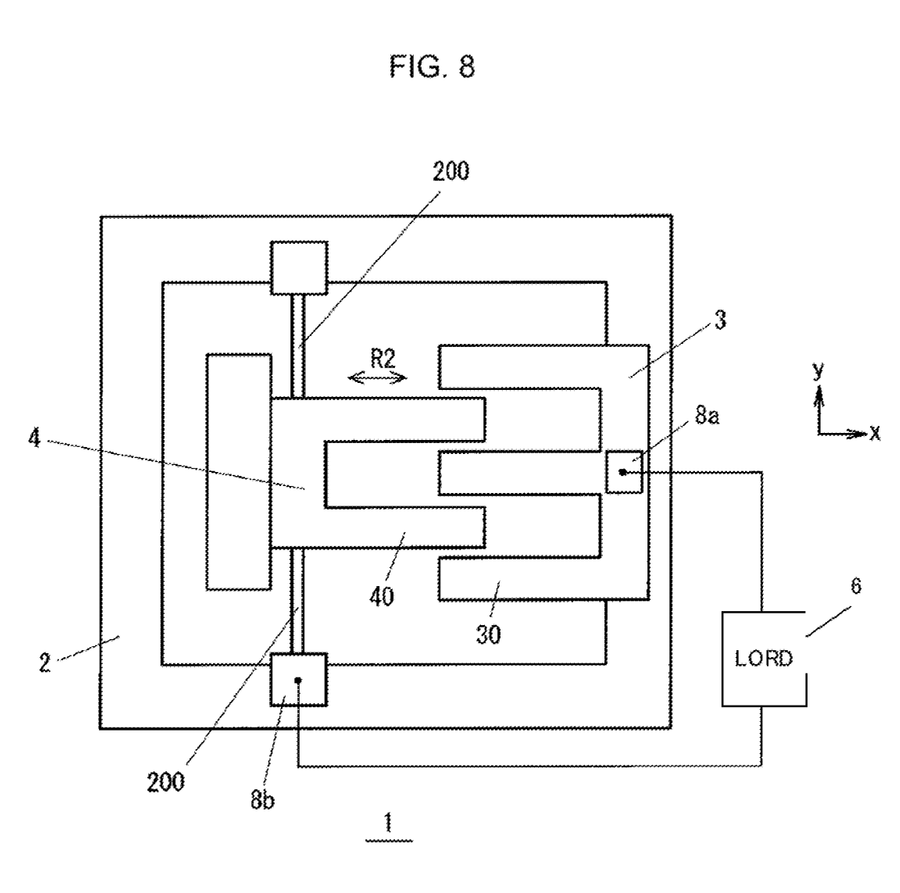
FIG. 8 is a view showing a first modification.

In the embodiment described above, the elastic supporting unit 5 has a cantilever structure, and the comb teeth 40 vibrate in the z direction with respect to the comb teeth 30. However, the movable electrode 4 may be supported by a pair of elastic supporting units 200 as in a first modification shown in FIG. 8. In the example shown in FIG. 8, the elastic supporting units 200 elastically supporting the movable electrode 4 deform to bend in the x direction (indicated by the arrow R2) and vibrate in the x direction. The thickness (dimension in the z direction) of the elastic supporting unit 200 is set to t2, and the thickness of the fixed electrode 3 and the movable electrode 4 is set to t1 (>t2). For such a vibration in the x direction, the dimension t in the equation (2) described above corresponds to the dimension of the elastic supporting units 200 in the x direction, and the dimension b corresponds to the dimension of the elastic supporting units 200 in the z direction. Also in this case, the resonance frequency of the vibration-driven energy harvester 1 can be adjusted by adjusting the dimension of the elastic supporting unit 200 in the z direction.

Second Modification

Figure 9:
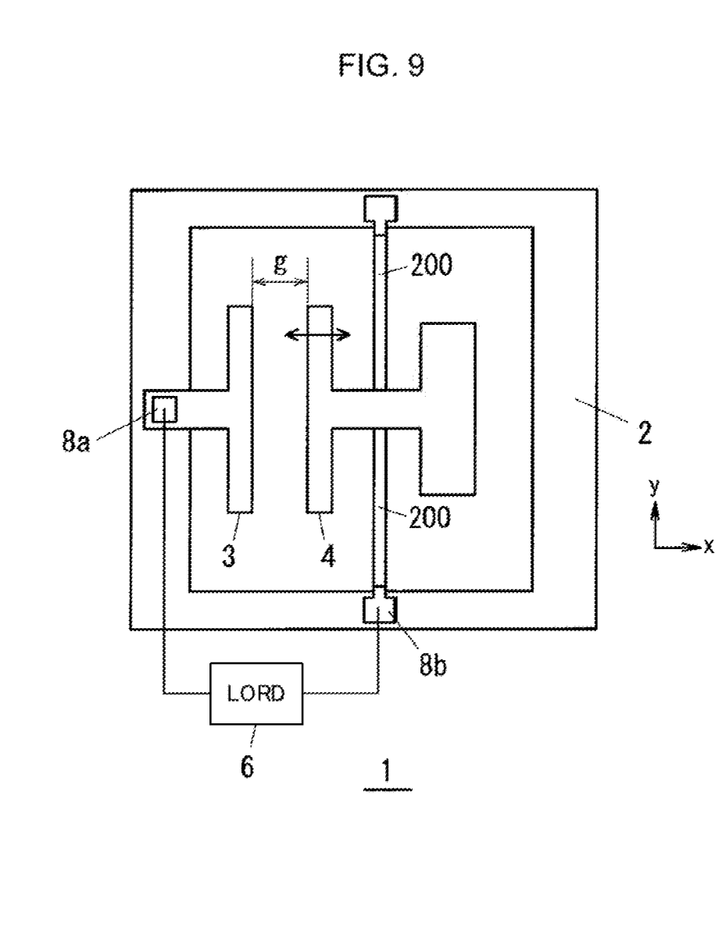
FIG. 9 is a view showing a second modification.

Further, the configuration of the fixed electrode 3 and the movable electrode 4 is not limited to the comb structure as described above. The configuration may be, for example, a parallel plate type electrode structure as in a second modification shown in FIG. 9. Also in this case, the thickness t2 of the elastic supporting unit 200 is set smaller with respect to the thickness t1 of the fixed electrode 3 and the movable electrode 4 (t2<t1). The movable electrode 4 vibrates in the x-direction to change a gap dimension g between the fixed electrode 3 and the movable electrode 4, thereby generating electric power.

Third Modification

Figure 10:
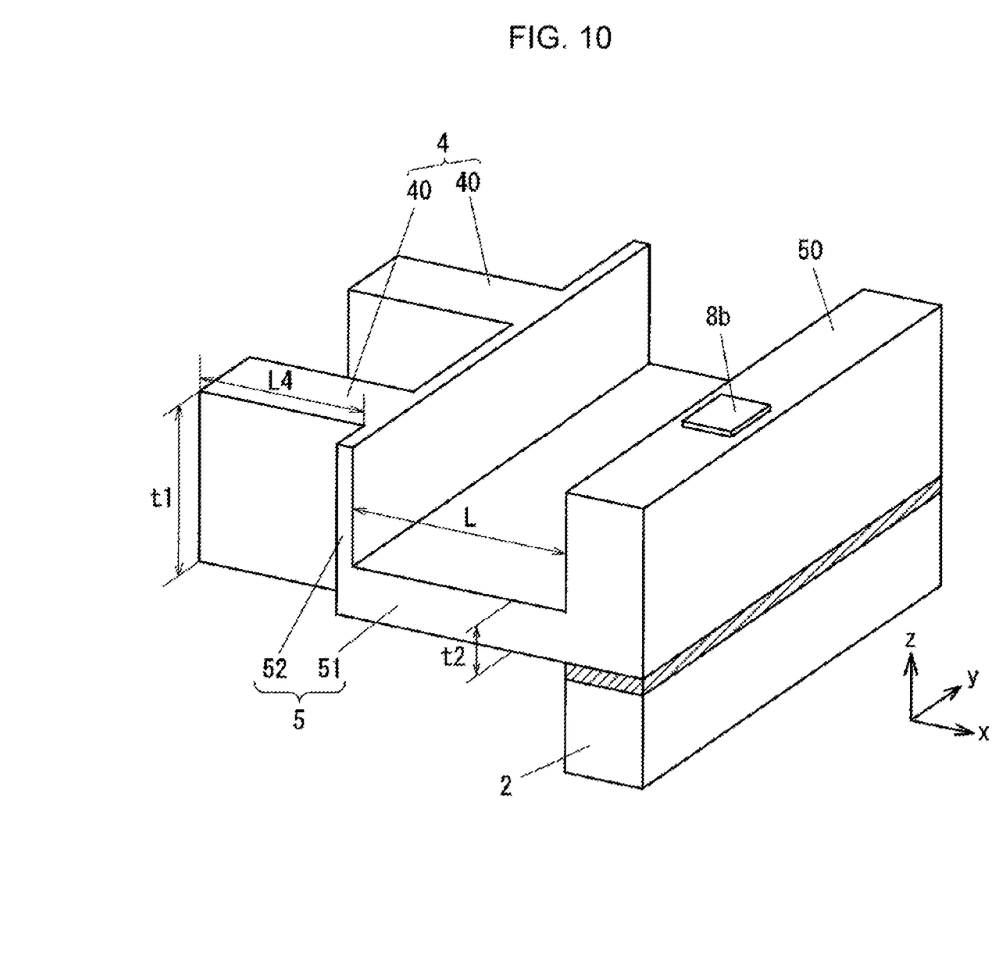
FIG. 10 is a view showing a third modification.

Further, as in a third modification shown in FIG. 10, the elastic supporting unit 5 may be configured by a deformation portion 51 having the thickness t2 and an electrode connecting portion 52 having the thickness t1.

Here, as can be understood from the equations (1), (2) described above, a longer length L of the portion having the thickness t2 of the elastic supporting unit 5 results in a lower resonance frequency f. For a shorter length L, the thickness t2 needs to be made thinner in order to obtain the same resonance frequency, which results in a decrease in mechanical strength of the elastic supporting unit 5. Further, a longer length L advantageously allows a larger amplitude of vibration to be generated. In other words, the length L of the elastic supporting unit 5 along its extending direction is preferably longer. For example, the length L of the portion having the thickness t2 is preferably set to be larger than a length L4 of the comb teeth 40 of the movable electrode 4.

Although various embodiments and modifications have been described above, the present invention is not limited to thereto. Furthermore, the embodiments and modifications may be applied alone or in combination. Other embodiments conceivable within the scope of the technical idea of the present invention are also included in the scope of the present invention.

The disclosure of the following priority application is herein incorporated by reference:

Japanese Patent Application No. 2017-154474 (filed Aug. 9, 2017)

REFERENCE SIGNS LIST

1 . . . vibration-driven energy harvester, 3 . . . fixed electrode, 4 . . . movable electrode, 5, 200 . . . elastic supporting unit, 30, 40 . . . comb tooth, 51 . . . deformation portion, 102 . . . device layer

The invention claimed is:

1. A micro electro mechanical system (MEMS) vibration element formed on a Silicon-on-Insulator (SOI) substrate which includes a handle layer, a SiO$_2$ layer, and a device layer, comprising:
 a fixed electrode formed in the device layer;
 a movable electrode formed in the device layer;
 a fixing portion formed in the device layer and fixed to the handle layer via the SiO$_2$ layer; and
 an elastic supporting unit integrally formed in the device layer with the fixing portion, the elastic supporting unit projecting from a surface of the fixing portion toward the fixed electrode, wherein the surface faces the fixed electrode, and elastically supporting the movable electrode with respect to the fixed electrode,
 wherein
 at least a portion of the elastic supporting unit has a dimension in a thickness direction of the device layer, the dimension being smaller than a dimension of the fixed electrode and the movable electrode in the thickness direction of the device layer, a length in an extending direction of the portion of the elastic supporting unit which has a dimension being smaller than a dimension of the fixed electrode is longer than a length in an extending direction of the movable electrode, and the fixed electrode, the movable electrode and the elastic supporting unit are not in contact with the handle layer.

2. The MEMS vibration element according to claim 1, wherein:

the fixed electrode and the movable electrode are electrodes having a comb structure.

3. The MEMS vibration element according to claim 2, wherein:

the length dimension of the portion of the elastic supporting unit along the extending direction of the elastic supporting unit is larger than a length dimension of comb teeth of the movable electrode.

* * * * *